United States Patent
Lee et al.

(10) Patent No.: US 12,213,240 B2
(45) Date of Patent: Jan. 28, 2025

(54) PIN-FIN COOLING FOR PRINTED CIRCUIT BOARDS (PCBS)

(71) Applicant: Hamilton Sundstrand Corporation, Charlotte, NC (US)

(72) Inventors: Yongduk Lee, Vernon, CT (US); Ankit Gupta, Willimantic, CT (US); Abbas A. Alahyari, Glastonbury, CT (US); Parag M. Kshirsagar, South Windsor, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 17/946,160

(22) Filed: Sep. 16, 2022

(65) Prior Publication Data

US 2024/0098878 A1    Mar. 21, 2024

(51) Int. Cl.
*H05K 1/02*      (2006.01)
*H05K 3/30*      (2006.01)

(52) U.S. Cl.
CPC .......... *H05K 1/0209* (2013.01); *H05K 3/303* (2013.01)

(58) Field of Classification Search
CPC ......... H05K 1/0201–021; H05K 1/115; H05K 1/181; H05K 7/20; H05K 7/20336; H05K 7/205; H05K 7/20254–20263; H05K 7/20963–20972; H05K 7/2039; H05K 7/20436–20445; H05K 3/303; H05K 3/4038; H05K 2201/064; H05K 2201/09554; H01L 23/3675; H01L 23/49568; H01L 23/473; H01L 23/36; G06F 1/20

See application file for complete search history.

(56) References Cited

U.S. PATENT DOCUMENTS

| 7,450,378 | B2 | 11/2008 | Nelson et al. |
| 8,711,561 | B2 | 4/2014 | Matsumoto et al. |
| 9,869,837 | B2* | 1/2018 | Morgan .................. G06F 1/181 |
| 2004/0037044 | A1 | 2/2004 | Cook et al. |

(Continued)

FOREIGN PATENT DOCUMENTS

| GB | 2536051 A | * | 9/2016 | .......... H01L 23/473 |
| JP | 2012069892 A | * | 4/2012 | |

OTHER PUBLICATIONS

GB-2536051-A English Translation (Year: 2016).*

(Continued)

*Primary Examiner* — Amir A Jalali

(57) ABSTRACT

Direct pin-fin cooling assemblies are disclosed for a high-power printed circuit boards (PCBs). The disclosure can solve the classical coldplate problem associated with liquid cooling of high-power PCBs namely: (1) Inhomogeneous cooling due to the calorimetric heating up of the coolant, (2) thermal interface material (TIM) related quality issues such as dry-out effects, (3) high cost due to complicated metal coldplate structure, and (4) low thermal conductivity due to multi-layer structure. This includes incorporating pin-fin direct cooling into high-power PCB structures without additional coldplate structure or TIM. In this approach, a TIM and a top plate of coldplate can be removed. Thus, the cooling performance can be improved because the thermal conductivity between a liquid coolant and a power device is increased.

20 Claims, 5 Drawing Sheets

(56) References Cited

U.S. PATENT DOCUMENTS

| | | | |
|---|---|---|---|
| 2005/0128706 A1* | 6/2005 | Maly | H01L 24/49 |
| | | | 257/E23.098 |
| 2009/0185350 A1* | 7/2009 | Grajcar | H05K 1/0204 |
| | | | 361/704 |
| 2009/0314467 A1 | 12/2009 | Campbell et al. | |
| 2010/0051972 A1* | 3/2010 | Chen | H05K 1/113 |
| | | | 257/E33.066 |
| 2011/0292662 A1 | 12/2011 | Grajcar | |
| 2014/0069615 A1* | 3/2014 | Kusaka | H01L 21/4882 |
| | | | 165/104.19 |
| 2014/0131847 A1* | 5/2014 | Yee | H01L 25/105 |
| | | | 257/E23.051 |
| 2014/0376184 A1* | 12/2014 | Gohara | H05K 7/20254 |
| | | | 361/689 |
| 2016/0049723 A1* | 2/2016 | Baks | H01Q 9/0457 |
| | | | 343/848 |
| 2016/0088720 A1* | 3/2016 | Willis | H01L 23/552 |
| | | | 361/709 |
| 2019/0206764 A1* | 7/2019 | Kulkarni | H01L 23/433 |
| 2020/0275583 A1* | 8/2020 | Lee | H05K 7/205 |
| 2020/0388557 A1* | 12/2020 | Yoo | H01L 23/3735 |
| 2021/0168965 A1 | 6/2021 | Shi et al. | |
| 2021/0267043 A1* | 8/2021 | Yoo | H05K 1/0206 |

OTHER PUBLICATIONS

JP-2012069892-A English Translation (Year: 2012).*
European Search Report dated Jan. 31, 2024 in connection with European Patent Application No. 23197759.6, 60 pages.

* cited by examiner

PIN-FIN COOLING FOR PRINTED CIRCUIT BOARDS (PCBS)

STATEMENT REGARDING FEDERALLY SPONSORED RESEARCH OR DEVELOPMENT

This invention was made with government support under contract no. DE-AR0001404 awarded by the U.S. ARPA-E. The government has certain rights in the invention.

BACKGROUND

1. Field

The present disclosure relates to printed circuit boards (PCBs), and more particularly to cooling for heat generating components connected to PCBs.

2. Description of Related Art

The designs of power electronic devices and systems are being continuously improved by becoming smaller in size and faster in switching frequency. The potential risk associated with these specific design improvements is an increase in power density and, consequently, a greater risk of thermal problems and failures. Typically, thermal conductivity is a material property that describes the ability of a material to conduct heat through the material. Conventional PCB materials such as FR4 have one of the lowest thermal conductivities and are not capable of meeting the continuously increasing demand of the thermal requirement of the high-power dissipation PCB. One of the current approaches to address this thermal dissipation problem is the use of a Metal Core Printed Circuit Board (MCPCB). However, even though an MCPCB has a higher thermal conductivity compared to an FR4 PCB, it still uses a thermal interface material (TIM) and a coldplate, which has a top plate between the source of heat and the cooling medium inside the coldplate. The TIM and the top plate of the coldplate are main a root causes that impede the cooling performance. Thus, the high-power density power electronics face challenges including how to improve the TIM layer, and how to maximize heat transfer at the top plate of the coldplate.

The conventional techniques have been considered satisfactory for their intended purpose. However, there is an ever-present need for improved systems and methods for cooling PCBs. This disclosure provides a solution for this need.

SUMMARY

A printed circuit board (PCB) assembly includes a PCB with a heat generating component mounted on a top side thereof. A plurality of pin-fins extend away from the PCB on a bottom side of the PCB opposite from the heat generating component.

There can be a thermal path defined through the PCB directly from the heat generating component into the plurality of pin-fins without passing through an intervening cold plate wall or thermal interface material (TIM) between the heat generating component and the plurality of pin-fins. The heat generating component can include a wide band gap (WBG) device selected from a group consisting of a GaN and a SiC MOSFET. A lid can be assembled onto the bottom side of the PCB, enclosing the pin-fins in a cooling channel defined between the lid and the PCB. A coolant medium such as a dielectric coolant fluid can be included in the cooling channel. The lid can include both hot and cold coolant paths. A sealing material can be included between the lid and the PCB for sealing coolant in the cooling channel.

The pin-fins can extend from a metal core of the PCB. The metal core can perform the role much as with a conventional FR4 core. Based on the metal core, more layers can be stacked up, e.g. starting with an aluminum core layer, a dielectric material layer can be stacked on which conduction layer can be stacked, on which a dielectric material layer can be stacked, on which a conduction layer can be stacked, on which a solder mask can be stacked. Each pin-fin can be joined to the metal core with an arc-welded weld joint. In the multi-layer PCB configuration, thermally conductive vias can extend through the conduction layer top for transferring of heat from the heat generating component to the pin-fins.

In case of sharing a hot and cold coolant path, two PCBs can be mounted with a coolant path wall. Thus, the lid will be replaced with a sidewall for a metal core and pin-fins on both sides. A second PCB can have a second heat generating component mounted on a top side thereof. A second plurality of pin-fins can extend away from the second PCB on a bottom side of the second PCB opposite from the second heat generating component. A sidewall component can be assembled between the bottom side of the first PCB and the bottom side of the second PCB to enclose the first and second pluralities of pin-fins in a cooling channel defined between the sidewall component and the first and second PCBs.

In the FR4 based PCB, each pin-fin in the plurality of pin-fins can extend from the top side of the PCB, through the FR4 material, and extends beyond the bottom side of the PCB to form a combined thermal via and pin-fin. Each of the pin-fins can be joined to the top side of the PCB with a solder joint. The heat generating component can be mounted to the top side of the PCB with a thermal pad or direct soldering between the heat generating component and at least one pin-fin in the plurality of pin-fins.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
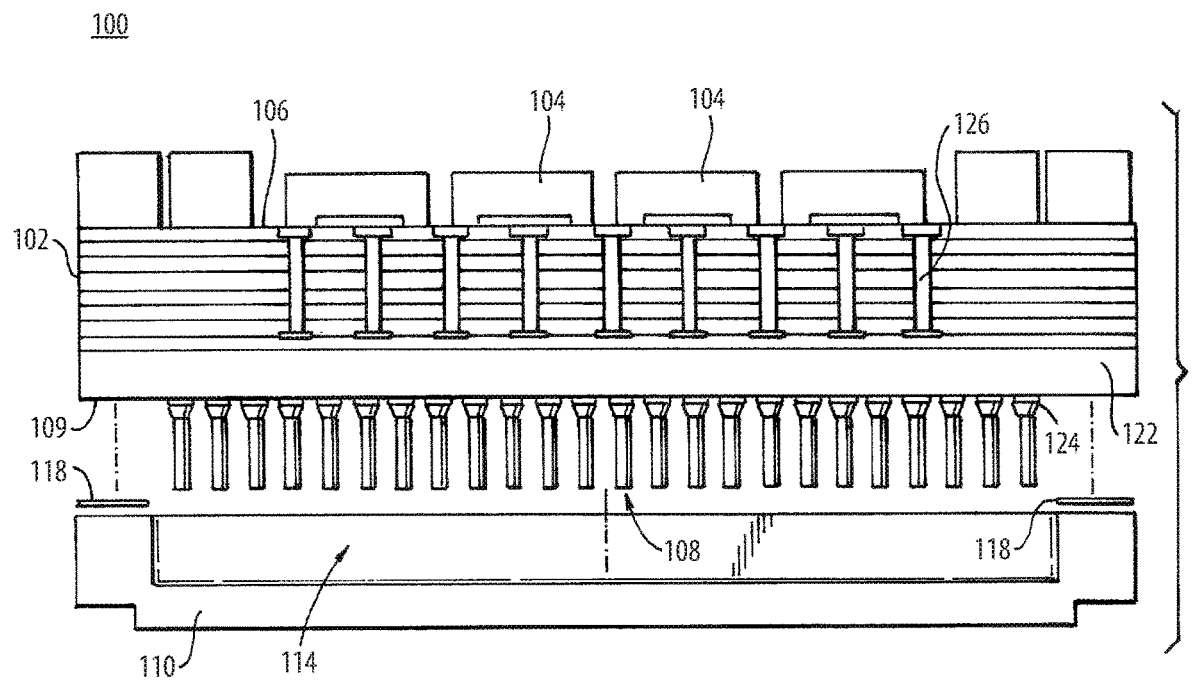
FIG. 1 is a schematic exploded cross-sectional view of an embodiment of a printed circuit board (PCB) assembly constructed in accordance with the present disclosure, showing a PCB with a metal core (MCPCB) with pin-fins for direct MCPCB based pin-fin cooling.

Reference will now be made to the drawings wherein like reference numerals identify similar structural features or aspects of the subject disclosure. For purposes of explanation and illustration, and not limitation, a partial view of an embodiment of a printed circuit board (PCB) assembly in accordance with the disclosure is shown in FIG. 1 and is designated generally by reference character 100. Other embodiments of systems in accordance with the disclosure, or aspects thereof, are provided in FIGS. 2-6, as will be described. The systems and methods described herein can be used to provide direct pin-fin cooling for high power semiconductors in PCBs, for use with cryogenic or non-conductive fluid or the like.

This invention disclosure proposes a direct pin-fin cooling for a high-power PCB. This solves the classical coldplate problems associated with liquid cooling of high-power PCB such as inhomogeneous cooling due to the calorimetric heating up of the coolant, thermal interface material (TIM) related quality issues such as dry-out effects, high cost due to complicated metal coldplate structure, and low thermal conductivity due to a multi-layer structure. Among them, the dominant factor for decreasing cooling performance is that to transfer heat from a power device to a coldplate, a thermal via and a TIM are used. Even if the coldplate has a high cooling performance, the top plate of coldplate is one more layer in the heat transfer path. The TIM can have a low thermal conductivity. Thus, this disclosure provides a high-power PCB and a pin-fin direct cooling structure without additional coldplate structures and TIM. In this approach, a TIM and a top plate of coldplate can be omitted from the heat transfer path between the heat generating components and the coolant. Thus, the cooling performance can be improved because the thermal conductivity between a liquid coolant and a power device is increased.

A first aspect is the metal core PCB (MCPCB) based pin-fin direct cooling as shown in FIG. 1. In this structure, all MCPCB fabrication can be completed using conventional processes, e.g. this structure can be made in conventional manufacturing facilities without having to utilize specialized manufacturing. The metal core plate can be used for pin-fin structures. To increase the heat transfer coefficient, an Arc-Welding Technology (AWT) can be used to form cooling structures to a pin-fin base plate. The metal core plate has a plurality of pin-fins and cooling liquid flows directly into the pin-fin area. The pin-fin cross-sectional shape can be round, square, or any other suitable pin shape. Square pin-fin shapes are suitable for achieving high thermal conductivity. However, any type of pin-fin shape can be used. The final step is to provide a bottom cover or lid, which can be of a polymer material. This cover or lid structure can provide potential benefits in terms of flexible shaping, light weight and low thermal conductivity from coolant to ambient. In addition, the MCPCB has high voltage dielectric layer, e.g. 6 kV insulation voltage. Thus, it has a high reliability in terms of partial discharging and high voltage insulation.

Figure 2:
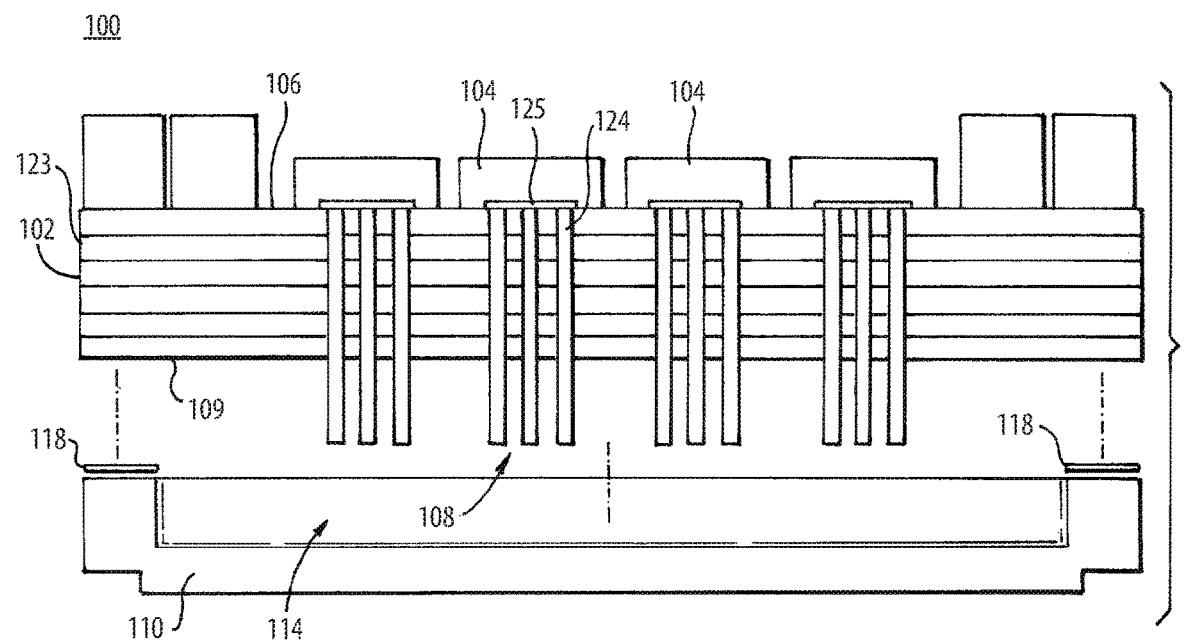
FIG. 2 is a schematic exploded cross-sectional view of an embodiment of a printed circuit board (PCB) assembly constructed in accordance with the present disclosure, showing a PCB of FR4 material with pin-fins for FR4 PCB based pin-fin direct cooling.

Another aspect is shown in FIG. 2, which shows the FR4 based pin-fin direct cooling structure. This replaces the thermal vias, e.g. as in FIG. 1, with long copper pillars. In this case, the copper pillar also used as a pin-fin. This approach can improve thermal conductivity dramatically compared to traditional cooling schemes. However, the electrical insulation may not be guaranteed if the copper pillar is directly connected to the thermal pad of power device (e.g. GaN or SiC) and a thermal pad is to be connected to source connector of a power device. Thus, this approach must be used with caution regarding partial discharging and low high-voltage insulation. Even if one uses a high voltage insulated thermal pad between a power device and a thermal pad, on cannot guarantee a partial discharge. Thus, the structure shown in FIG. 2 may be best suitable for lower voltage applications.

Figure 3:
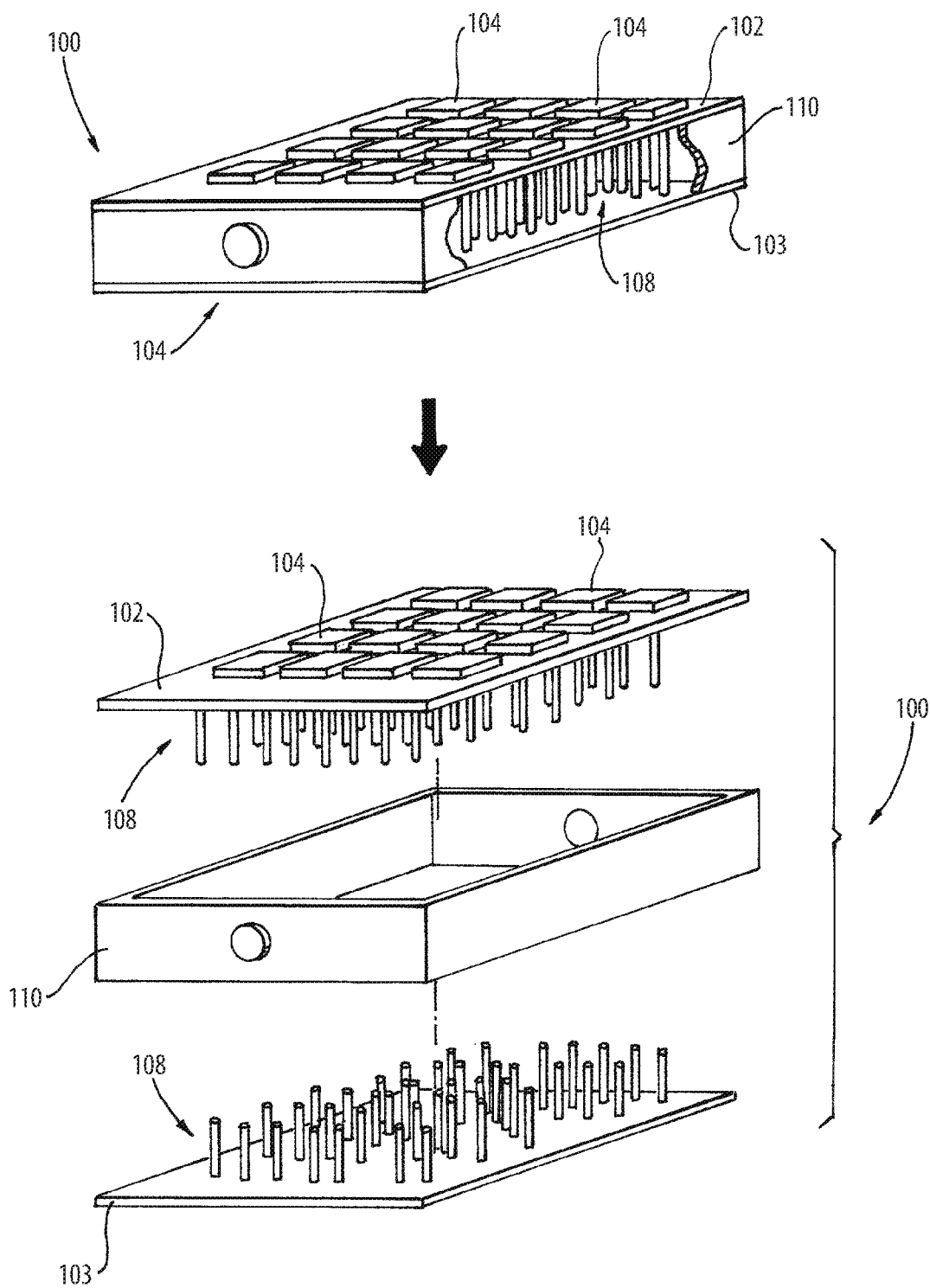
FIG. 3 is a schematic perspective view of a process for making an assembly as shown in FIG. 1, with a double sided pin-fin cooling configuration, which is also applicable to the FR4 PCB cooling of FIG. 2.
Figure 4:
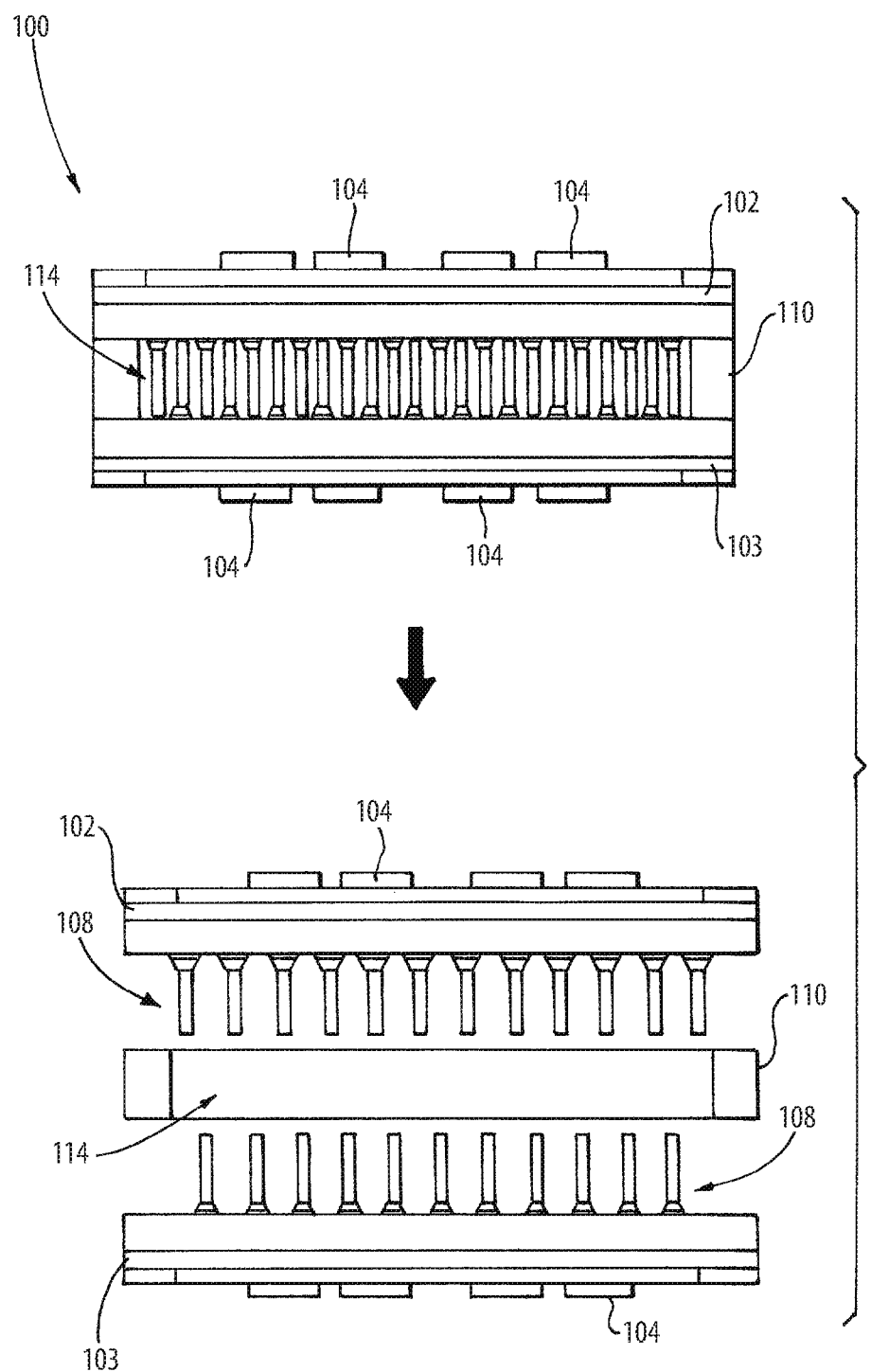
FIG. 4 is a schematic cross-sectional side elevation view of the process of FIG. 3.

A third aspect is the double-sided pin-fin cooling structure shown in FIGS. 3-4. The basic concept is same as shown in FIG. 1, but could also be applied to the structure of FIG. 2, with a little modification that is the polymer cover or lid has PCB mounting structures on both sides.

Figure 5:
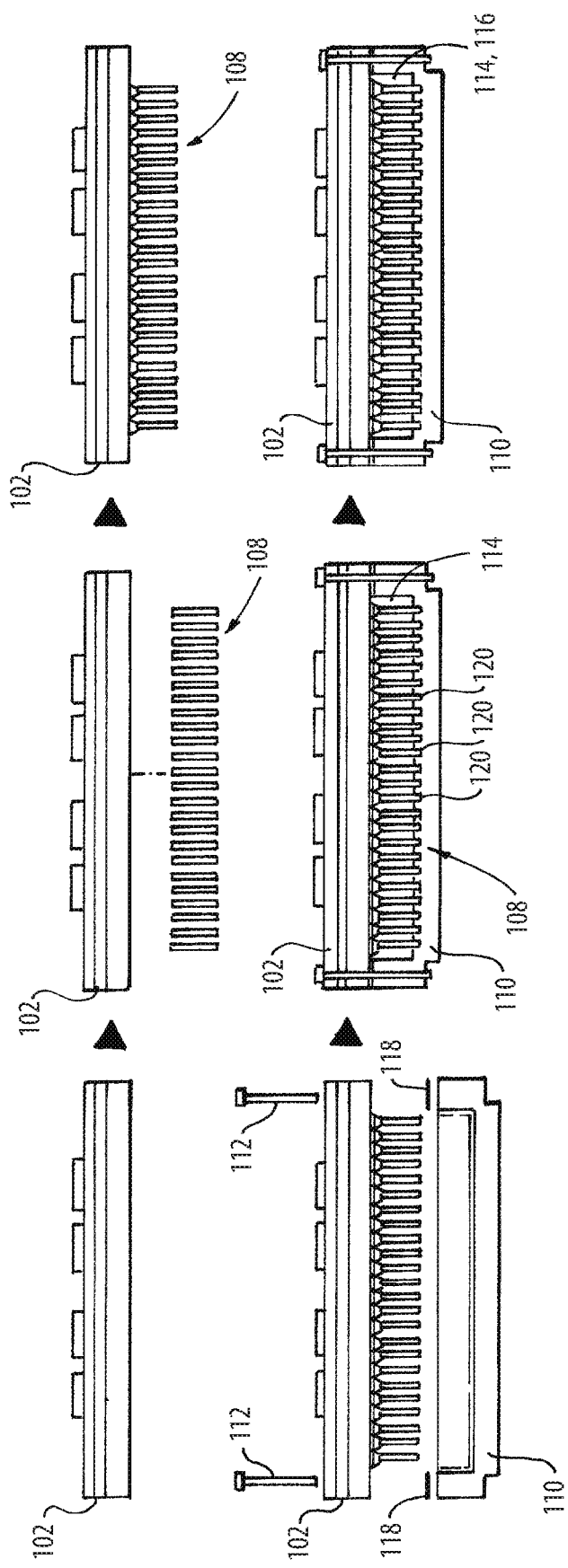
FIG. 5 is a schematic view of a process for making the assembly of FIG. 1, showing fabrication of the assembly including the direct cooling pin-fins.

A fourth aspect is the assembly process, as shown in FIG. 5. This process has a potential benefit in an easy fabrication method and an easy assembly process. The first step is to assemble a cooling pin-fins on the metal core plate or PCB through holes. The second step is to assemble a polymer cover or lid to the PCB. In order to minimize a leaking, a laser-cut adhesives material can be used, such as Indium. In addition, a low temperature sealing materials can be used for cryogenic liquid coolant.

Potential benefits are as follows: high power density and reduced package thickness, good thermal performance, homogeneous cooling by direct pin-fins, no thermal interface material (TIM), so no dry-out effects, high thermal conductivity by omitting TIM and omitting a top plate of the traditional coldplate, light weight provided by polymer cover or lid structure and omitting the top plate of the traditional coldplate, and low-cost by polymer coldplate and being able to make use of existing fabrication processes and equipment.

With reference again to FIG. 1, a printed circuit board (PCB) assembly 100 includes a PCB 102 with heat generating components 104 mounted on a top side 106 thereof. A plurality of pin-fins 108 extend away from the PCB 102 on a bottom side 109 of the PCB 102 opposite from the heat generating components 104.

There is a thermal path defined through the PCB 102 directly from the heat generating components 104, into the plurality of pin-fins 108, which can release heat into a coolant, without passing through an intervening cold plate wall or thermal interface material (TIM) between the heat generating components 104 and the plurality of pin-fins 108. This direct cooling thermal path 114, which can be filled with coolant 116 is indicated in FIG. 1 with the large arrow. The heat generating components can include a wide band gap (WBG) device, such as a GaN or a SiC MOSFET.

A cover or lid 110, e.g. of a polymer material, is assembled onto the bottom side 109 of the PCB, e.g. using fasteners 112 as indicated in FIG. 5, enclosing the pin-fins 108 in a cooling channel 114 defined between the lid 110 and the PCB 102. The cooling channel can be filed with coolant 116 such as dielectric coolant fluid, which is labeled in FIG. 5. A sealing material 118 can be included between the lid 110 and the bottom side 106 of the PCB 102 for sealing coolant 116 (labeled in FIG. 5) in the cooling channel 114. As indicated in FIG. 5, the lid 110 can include pin-fin holes or receptacles 120 for receiving the ends of the pin-fins 108

The pin-fins 108 extend from a metal core 122 of the PCB 102. The metal core is a bottom layer of the PCB 102. The metal core 122 is a core of the PCB 102 upon which more layers can be stacked up, e.g. starting from an aluminum core layer, on which a dielectric material layer can be stacked, on which a conduction layer can be stacked, on which a dielectric material layer can be stacked, on which a conduction layer can be stacked, on which a solder mask can be stacked. Each pin-fin 108 is joined to the metal core with an arc-welded weld joint 124. Thermally conductive vias 126 extend through the PCB 102 from the top side of the PCB 106 toward the metal core 122 for conduction of heat from the heat generating components 104 to the pin-fins 108.

Figure 6:
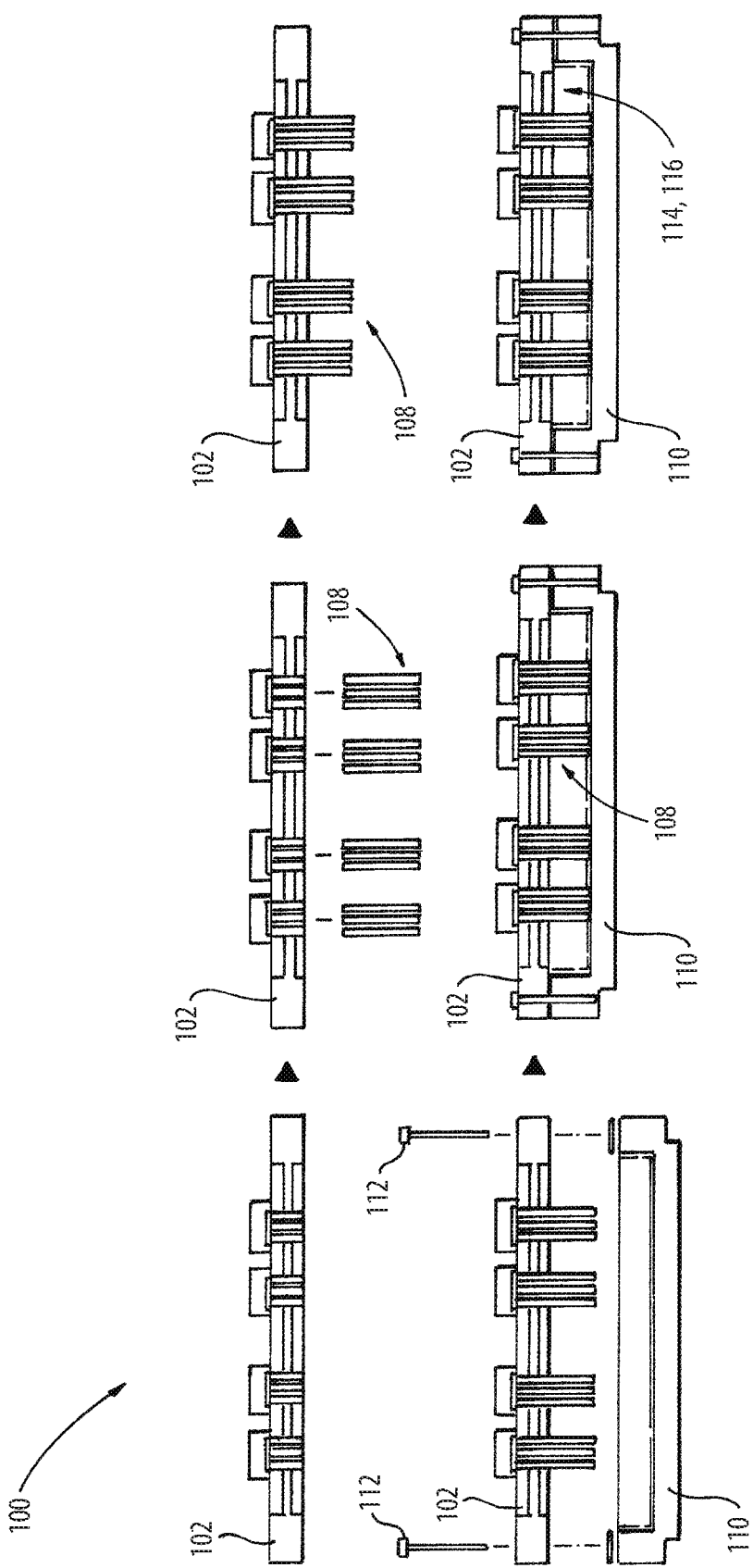
FIG. 6 is a schematic view of a process for making the assembly of FIG. 2, showing fabrication of the assembly including the direct cooling pin-fins.

With reference now to FIG. 2, a similar assembly 100 is shown wherein the PCB includes an FR4 material, and does not have a metal core 122. Each pin-fin 108 extends from the top side 106 of the PCB 102, through the FR4 material 123, and extends beyond the bottom side 109 of the FR4 material 123 to form a combined thermal via and pin-fin 108. Each of the pin-fins 108 is joined to the top side 106 of the PCB 102 with a solder joint 124. The heat generating components are mounted to the top side 106 of the PCB 102 with a thermal pad 125 or direct soldering between the heat generating component 104 and at least one pin-fin 108 in the plurality of pin-fins 108. FIG. 6 shows steps in assembling the assembly of FIG. 1, which are similar to those described above with respect to FIG. 5.

In FIGS. 3 and 4, a second PCB 103 has its own heat generating components 104 mounted on a top side thereof, just as described above with reference to FIG. 1. A second plurality of pin-fins 108 extend away from the second PCB 103 on a bottom side of the second PCB, just as described above with reference to FIG. 1. A sidewall component 110, which can be of a polymer material, is assembled between the bottom side 109 (labeled in FIG. 1) of the first PCB 102 and the bottom side of the second PCB 103 to enclose the first and second pluralities of pin-fins 108 in a cooling channel 114 defined between the sidewall component 110 and the first and second PCBs 102, 103. Those skilled in the art will readily appreciate that this two-sided structure can also be used with two of the PCB's 102 as shown in FIG. 2, or with one PCB 102 as shown in FIG. 1 assembled together with one of the PCBs 102 as shown in FIG. 2.

The methods and systems of the present disclosure, as described above and shown in the drawings, provide for direct pin-fin cooling for high power semiconductors in PCBs, for use with cryogenic or non-conductive fluid or the like. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A printed circuit board (PCB) assembly comprising:
a PCB including a metal core, a dielectric material layer over the metal core, and a conduction layer over the dielectric material layer;
a heat generating component mounted on a top side of the PCB;
a plurality of pin-fins extending away from the metal core of the PCB on a bottom side of the PCB opposite from the heat generating component, wherein the heat generating component is mounted to the top side of the PCB with a thermal pad or direct soldering between the heat generating component and at least one pin-fin in the plurality of pin-fins, wherein each pin-fin in the plurality of pin-fins extends from the top side of the PCB through the dielectric material layer and extends beyond the bottom side of the PCB to form a combined thermal via and pin-fin, and wherein at least one pin-fin in the plurality of pin-fins is joined to the metal core with an arc-welded joint; and
a lid assembled onto the bottom side of the PCB and enclosing the plurality of pin-fins in a cooling channel defined between the lid and the PCB, the cooling channel including a hot coolant path and a cold coolant path.

2. The assembly as recited in claim 1, wherein there is a thermal path defined through the PCB directly from the heat generating component into the plurality of pin-fins without passing through an intervening cold plate wall between the heat generating component and the plurality of pin-fins.

3. The assembly as recited in claim 1, wherein there is a thermal path defined through the PCB directly from the heat generating component into the plurality of pin-fins without passing through an intervening thermal interface material (TIM) between the heat generating component and the plurality of pin-fins.

4. The assembly as recited in claim 1, wherein the heat generating component includes a wide band gap (WBG) device selected from a group consisting of a GaN and a SiC MOSFET.

5. The assembly as recited in claim 1, further comprising a dielectric coolant fluid in the cooling channel.

6. The assembly as recited in claim 1, further comprising a sealing material between the lid and the PCB for sealing a coolant in the cooling channel.

7. The assembly as recited in claim 1, wherein the dielectric material layer comprises FR4.

8. The assembly as recited in claim 7, wherein the metal core is a bottom layer of the PCB.

9. The assembly as recited in claim 7, wherein each pin-fin is joined to the metal core with an arc-welded weld joint.

10. The assembly as recited in claim 7, further comprising thermally conductive vias extending through the PCB from the top side of the PCB toward the metal core for conduction of heat from the heat generating component to the plurality of pin-fins.

11. The assembly as recited in claim 7, wherein the metal core comprises aluminum.

12. The assembly as recited in claim 1, wherein:
the PCB is a first PCB;
the heat generating component is a first heat generating component;
the plurality of pin-fins is a first plurality of pin-fins;
the lid comprises a sidewall component;
the assembly further comprises:
a second PCB;
a second heat generating component mounted on a top side of the second PCB; and
a second plurality of pin-fins extending away from the second PCB on a bottom side of the second PCB opposite from the second heat generating component; and
the sidewall component is assembled between the bottom side of the first PCB and the bottom side of the second PCB to enclose the first and second pluralities of pin-fins in the cooling channel.

13. The assembly as recited in claim 12, wherein the sidewall component comprises a polymer material.

14. The assembly as recited in claim 12, wherein the second PCB includes a second metal core, a second dielectric material layer over the second metal core, and a second conduction layer over the second dielectric material layer.

15. The assembly as recited in claim 1, wherein each pin-fin in the plurality of pin-fins is joined to the top side of the PCB with a solder joint.

16. The assembly as recited in claim 1, wherein the lid comprises a polymer material.

17. The assembly as recited in claim 1, wherein the lid is fastened to the bottom side of the PCB with a laser cut adhesive material.

18. The assembly as recited in claim 1, wherein the lid is fastened to the bottom side of the PCB with at least one fastener.

19. The assembly as recited in claim 1, wherein at least one pin-fin in the plurality of pin-fins has a square cross-sectional shape.

20. The assembly as recited in claim 1, wherein the lid further comprises a plurality of pin fin holes configured to receive ends of the plurality of pin-fins.

* * * * *